(12) United States Patent
Hashimoto

(10) Patent No.: US 7,169,643 B1
(45) Date of Patent: Jan. 30, 2007

(54) SEMICONDUCTOR DEVICE, METHOD OF FABRICATING THE SAME, CIRCUIT BOARD, AND ELECTRONIC APPARATUS

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 514 days.

(21) Appl. No.: 09/615,503

(22) Filed: Jul. 13, 2000

Related U.S. Application Data

(63) Continuation-in-part of application No. 09/511,081, filed on Feb. 23, 2000, now Pat. No. 6,326,233, which is a continuation of application No. 09/220,595, filed on Dec. 28, 1998, now Pat. No. 6,057,174.

(30) Foreign Application Priority Data

Jun. 28, 2000 (JP) .............................. 2000-194045

(51) Int. Cl.
H01L 21/00 (2006.01)
(52) U.S. Cl. .................. 438/110; 438/111; 438/112; 438/113; 438/114; 29/25.01
(58) Field of Classification Search ................ 438/706, 438/110, 112, 118, 121, 122, 464, 111, 113, 438/114, 907, 908, FOR. 365, FOR. 366, 438/FOR. 367; 29/25.01
See application file for complete search history.

(56) References Cited

U.S. PATENT DOCUMENTS

| | | | |
|---|---|---|---|
| 3,689,991 A | * | 9/1972 | Aird .............................. 29/827 |
| 3,698,076 A | * | 10/1972 | Kingsley ................ 228/180.21 |
| 3,724,068 A | * | 4/1973 | Galli ............................. 29/833 |
| 3,968,563 A | * | 7/1976 | Hamlin .......................... 29/827 |
| 4,330,790 A | * | 5/1982 | Burns .......................... 257/671 |
| 4,689,875 A | * | 9/1987 | Solstad .......................... 29/827 |
| 4,716,124 A | * | 12/1987 | Yerman et al. ................ 438/15 |
| 4,801,561 A | * | 1/1989 | Sankhagowit ................ 29/827 |
| 4,818,726 A | * | 4/1989 | Flaten ........................... 29/827 |
| 4,980,219 A | * | 12/1990 | Hiraide et al. .............. 428/134 |
| 5,285,105 A | * | 2/1994 | Cain ........................... 257/672 |
| 5,371,328 A | * | 12/1994 | Gutierrez et al. ............ 174/261 |
| 5,427,641 A | * | 6/1995 | Muramatsu et al. ......... 156/252 |
| 5,583,378 A | * | 12/1996 | Marrs et al. ................ 257/710 |
| 5,631,497 A | | 5/1997 | Miyano et al. |
| 5,661,086 A | * | 8/1997 | Nakashima et al. ......... 257/668 |
| 5,800,747 A | * | 9/1998 | Cavasin ........................ 264/39 |
| 5,804,872 A | | 9/1998 | Miyano et al. |
| 5,854,741 A | * | 12/1998 | Shim et al. .................. 361/813 |
| 5,886,398 A | * | 3/1999 | Low et al. .................... 257/667 |
| 5,905,633 A | * | 5/1999 | Shim et al. .................. 361/704 |
| 5,953,589 A | * | 9/1999 | Shim et al. .................. 438/106 |

(Continued)

FOREIGN PATENT DOCUMENTS

EP 0526147 A2 2/1993

(Continued)

Primary Examiner—David E. Graybill
(74) Attorney, Agent, or Firm—Oliff & Berridge, PLC

(57) ABSTRACT

A method of fabricating a semiconductor device comprising: a step (a) of attaching a plurality of semiconductor chips to a tape; a step (b) of cutting the tape; and a step (c) of providing a plurality of external terminals on an insulating film cut from the tape, wherein the steps (a) and (b) are carried out in a reel-to-reel transport system.

20 Claims, 13 Drawing Sheets

U.S. PATENT DOCUMENTS

| | | | |
|---|---|---|---|
| 6,021,563 A * | 2/2000 | Heo et al. | 29/846 |
| 6,033,933 A * | 3/2000 | Hur | |
| 6,057,174 A * | 5/2000 | Hashimoto | |
| 6,063,139 A * | 5/2000 | Fukaya | 29/25.01 |
| 6,064,114 A * | 5/2000 | Higgins, III | 257/698 |
| 6,066,512 A * | 5/2000 | Hashimoto | |
| 6,114,189 A * | 9/2000 | Chia et al. | 438/112 |
| 6,146,920 A * | 11/2000 | Inoue et al. | 438/113 |
| 6,235,555 B1 * | 5/2001 | Cho | 438/112 |
| 6,279,226 B1 * | 8/2001 | Ohkubo et al. | 29/740 |
| 6,326,233 B1 | 12/2001 | Hashimoto | |
| 6,326,696 B1 * | 12/2001 | Horton et al. | 257/777 |
| 6,395,582 B1 * | 5/2002 | Sohn et al. | 438/111 |
| 6,472,726 B1 | 10/2002 | Hashimoto | |
| 2002/0096253 A1 * | 7/2002 | Shim et al. | 156/297 |
| 2002/0100165 A1 * | 8/2002 | Glenn | 29/841 |
| 2003/0015791 A1 | 1/2003 | Hashimoto | |

FOREIGN PATENT DOCUMENTS

| | | |
|---|---|---|
| JP | A-2-12848 | 1/1990 |
| JP | A-3-215953 | 9/1991 |
| JP | 05-047955 | 2/1993 |
| JP | 06-338543 | 12/1994 |
| JP | 08-031866 | 2/1996 |
| JP | 08-078482 | 3/1996 |
| JP | 10-098073 | 4/1998 |
| JP | 10-261674 | 9/1998 |
| JP | 11-087902 | 3/1999 |
| JP | 11-126854 | 5/1999 |
| JP | 11-176873 | 7/1999 |
| WO | WO9935682 | 7/1999 |
| WO | 2000-058701 | 2/2000 |
| WO | WO0007235 | 2/2000 |

* cited by examiner

SEMICONDUCTOR DEVICE, METHOD OF FABRICATING THE SAME, CIRCUIT BOARD, AND ELECTRONIC APPARATUS

This is a Continuation-in-Part of application Ser. No. 09/511,081 filed Feb. 23, 2000 now U.S. Pat. No. 6,326,233, which in turn is a Continuation of application Ser. No. 09/220,595 now U.S. Pat. No. 6,057,174 filed Dec. 28, 1998. The entire disclosure of the prior applications is hereby incorporated by reference herein in its entirety.

BACKGROUND OF THE INVENTION

1. Field of the Invention

The present invention relates to a semiconductor device, a method of fabricating the same, a circuit board, and an electronic apparatus.

2. Description of the Related Art

In the microminiaturization of semiconductor devices, a bare chip mounting arrangement is regarded as an ideal form of assembly. However, since quality assurance and the handling of a bare chip are difficult, the chip is assembled in a package during semiconductor device fabrication. As one of the package forms meeting the need for high pin counts, a ball grid array (BGA) type package has been developed recently. On a substrate of the BGA type package, external terminal bumps are arranged in an area array to permit surface mounting.

As one kind of BGA type package, there is a tape ball grid array (T-BGA) package in which a film carrier tape is used as a base in fabrication with a tape automated bonding (TAB) technique. In T-BGA packaging using the TAB technique, semiconductor chips can be assembled continuously.

Since the film carrier tape is liable to warp due to lack of rigidity, however, it is required to attach a reinforcing sheet (stiffener). In a process of semiconductor device fabrication, the stiffener is attached to an individual film package punched out after each semiconductor chip is mounted on the film carrier tape. More particularly, the film carrier tape is punched out into separate film packages, and then the stiffener is individually attached.

In this method, after the stiffener has been attached as mentioned above, the film packages must be handled individually in subsequent processes such as bump formation, resulting in trouble in fabrication.

It is therefore an objective of the present invention to obviate the above-mentioned drawback by providing a semiconductor device, a method of fabricating the same, a circuit board, and an electronic apparatus, which allow easy handling.

SUMMARY OF THE INVENTION (1) According to a first aspect of the present invention, there is provided a method of fabricating a semiconductor device comprising:

a step (a) of attaching a plurality of semiconductor chips to a tape;

a step (b) of cutting the tape; and a step (c) of providing a plurality of external terminals on a substrate cut from the tape in the step (b), wherein the steps (a) and (b) are carried out in a reel-to-reel transport system.

According to the present invention, the steps of attaching the semiconductor chips and of cutting the tape are carried out continuously with a reel-to-reel transport system. As a result, the productivity can be improved, and the manufacturing cost can be reduced. However, since it is difficult to provide the external terminals in a reel-to-reel transport system, the external terminals are provided after the tape is cut in the present invention. According to the present invention, a general-purpose device can be used to provide the external terminals. If a faulty sample occurs in the step of providing the external terminals, the disposal losses are less than in a reel-to-reel transport system.

(2) This method of fabricating a semiconductor device may further comprise a step of adhering a reinforcing member to the tape in positions corresponding to each of the semiconductor chips, before the step (b).

Here the reinforcing member includes anything which has the function of preventing the tape from warping (maintains flatness), and commonly for example an item known as a stiffener is used.

By this means, since the step of adhering the reinforcing member is also carried out continuously in a reel-to-reel transport system, the productivity can be improved, and the manufacturing cost can be reduced.

(3) In this method of fabricating a semiconductor device, the tape may be cut into regions each including one of the semiconductor chips in the step (b).

By this means, the tape is cut into pieces for individual semiconductor chips, and the subsequent processes are carried out on pieces having a single semiconductor chip.

(4) In this method of fabricating a semiconductor device, the tape may be cut into regions each including two or more of the semiconductor chips in the step (b).

By this means, since a plurality (but not all) of the semiconductor chips are attached to the substrate cut from the tape, subsequent processes can be carried out on a plurality of semiconductor chips.

(5) In this method of fabricating a semiconductor device, the substrate cut from the tape may be further cut into the semiconductor chips after the step (c).

In this way, a semiconductor device having a single semiconductor chip can be obtained.

(6) In this method of fabricating a semiconductor device, a plurality of device holes may be formed in the tape, and leads may be formed above the tape, whose end portions project into the respective device holes; and each of the semiconductor chips may be disposed within a respective of the device holes, and the electrodes of the semiconductor chips and the leads may be bonded in the step (a).

In this method, TAB (Tape Automated Bonding) technology can be applied.

(7) In this method of fabricating a semiconductor device, each of the semiconductor chips may be bonded to the tape in a face-down configuration in the step (a).

(8) In this method of fabricating a semiconductor device, by means of an anisotropic conductive material, the electrodes of the semiconductor chips and leads formed above the tape may be electrically connected in the step (a).

(9) In this method of fabricating a semiconductor device, each of the semiconductor chips may be bonded to the tape in a face-up configuration in the step (a).

(10) In this method of fabricating a semiconductor device, the electrodes of the semiconductor chips and leads formed above the tape may be electrically connected by means of wires in the step (a).

(11) This method of fabricating a semiconductor device may further comprise a step of adhering a heat radiating member to each of the semiconductor chips.

The heat radiating member promotes the radiation of heat from the semiconductor chip, and is adhered according to the amount of heat generated by the semiconductor chip.

(12) In this method of fabricating a semiconductor device, the step of adhering the heat radiating member may be carried out before the step (b), with a reel-to-reel transport system.

By this means, the step of adhering the heat radiating member is carried out before cutting the tape, and can therefore be carried out continuously and efficiently.

(13) According to a second aspect of the present invention, there is provided a semiconductor device fabricated by the above-described method.

(14) According to a third aspect of the present invention, there is provided a circuit board having mounted the above semiconductor device.

(15) According to a fourth aspect of the present invention, there is provided an electronic apparatus including the above semiconductor device.

DETAILED DESCRIPTION OF THE PREFERRED EMBODIMENTS

Embodiments of the present invention will now be described below with reference to the accompanying drawings.

First Embodiment

Figure 4A:
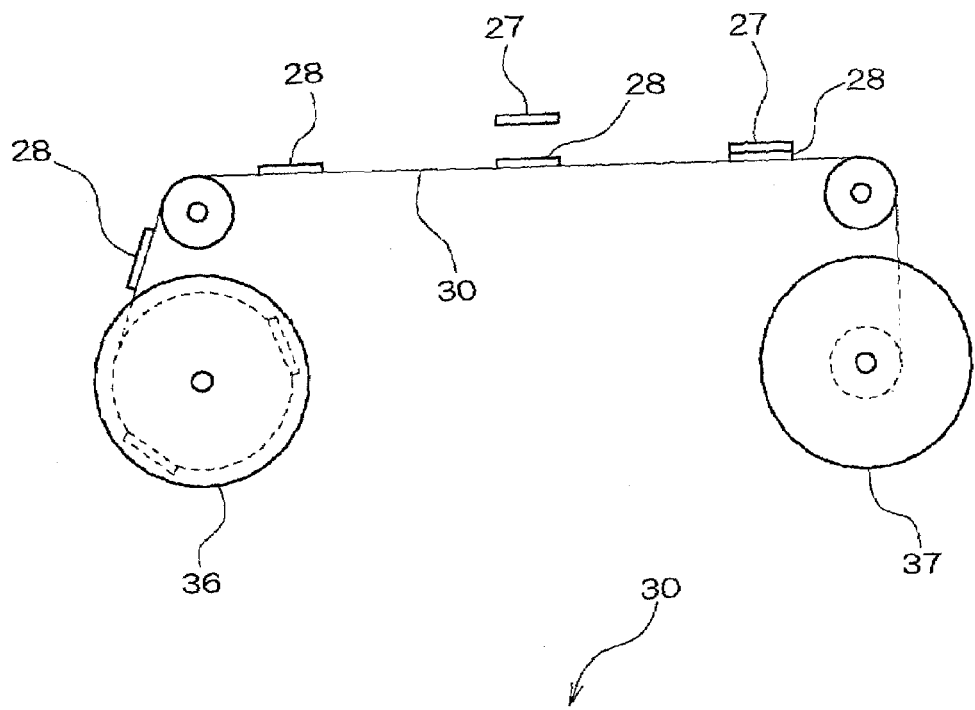
FIGS. 4A and 4B are diagrams illustrating the first embodiment of the semiconductor device fabrication method according to the present invention.
Figure 4B:
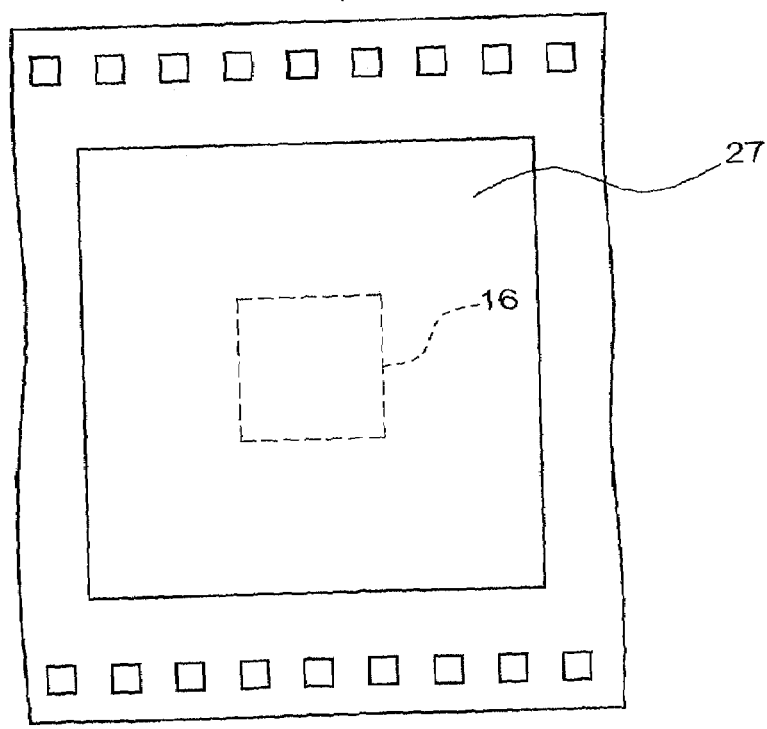
Figure 5:
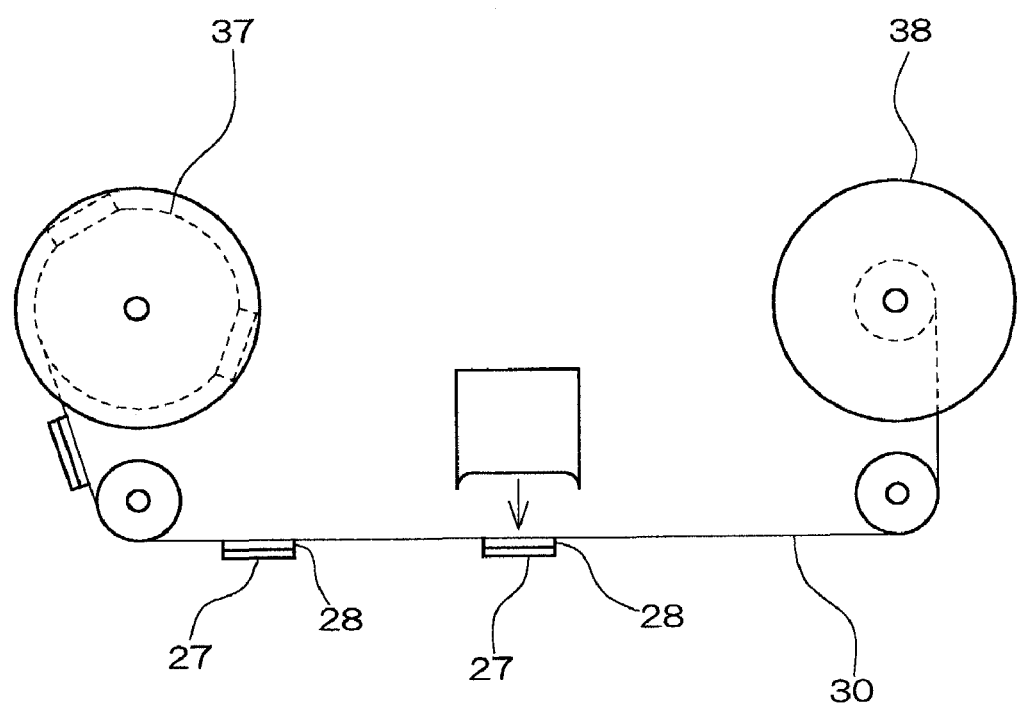
FIG. 5 is a diagram illustrating the first embodiment of the semiconductor device fabrication method according to the present invention.
Figure 6:
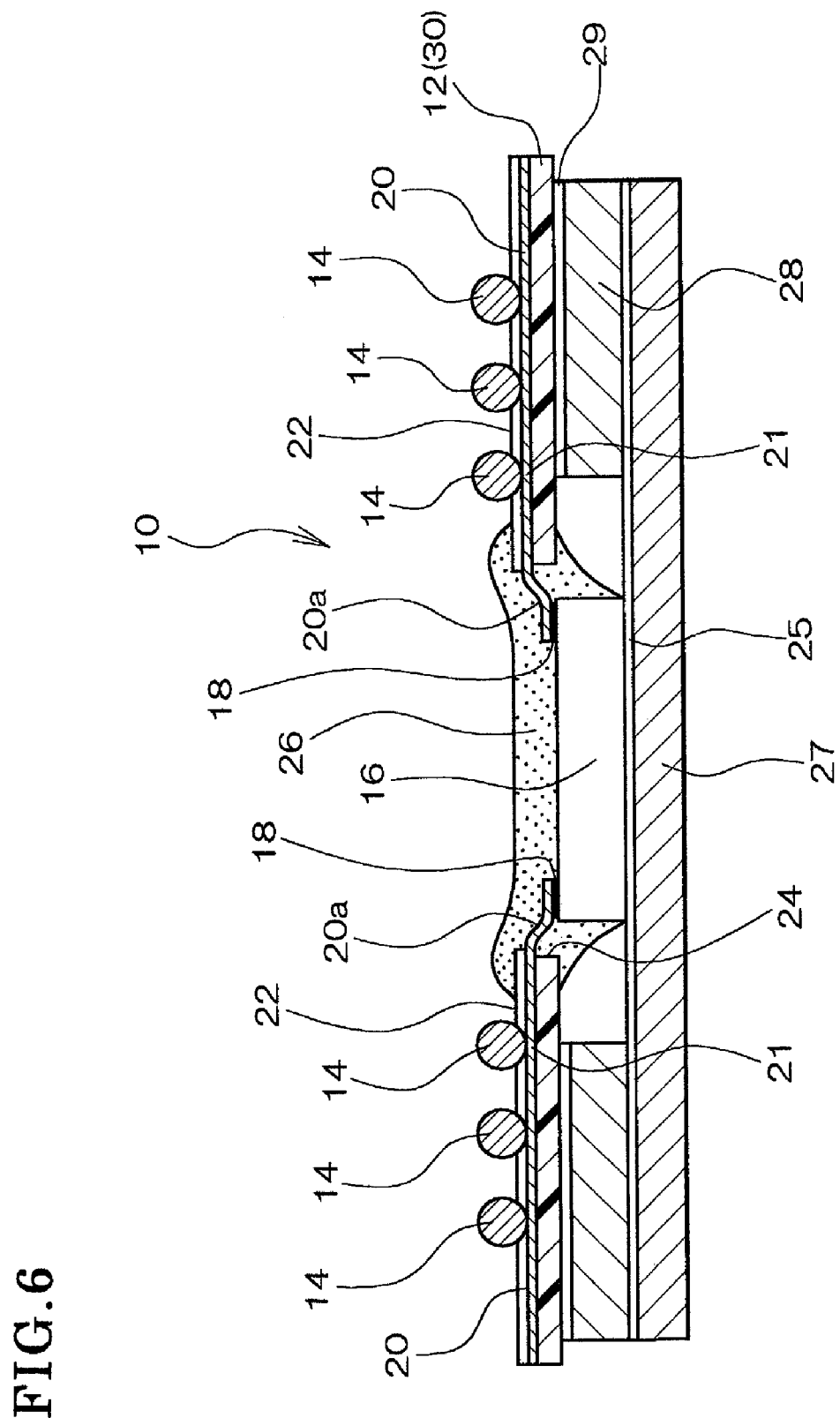
FIG. 6 is a diagram illustrating the first embodiment of the semiconductor device fabrication method according to the present invention.

FIGS. 1A through 6 are diagrams illustrating the steps in the first embodiment of the semiconductor device fabrication method of the present invention. FIG. 6 also shows the embodiment of a finished semiconductor device according to the present invention.

As shown in FIG. 6, a BGA package is applied to a semiconductor device 10. In this figure, the semiconductor device 10 comprises an insulating film 12 being an example of a substrate, a plurality of leads 20 formed on the insulating film 12, an external terminal 14 formed on each of the leads 20, and a semiconductor chip 16, and surface mounting can be implemented by using the plurality of external terminals 14.

The insulating film 12 is formed by punching out a long film carrier tape 30 (see FIG. 1B) being an example of a tape, using the TAB technique in a process of fabrication. The insulating film 12 is formed to be larger than the semiconductor chip 16, and a device hole 24 formed on the film carrier tape 30 remains on the insulating film 12.

One end portion 20a of the lead 20 protrudes into the device hole 24, and the end portion 20a is connected to an electrode 18 of the semiconductor chip 16. More particularly, on the side of the insulating film 12 opposite to the mounting side of the lead 20, the semiconductor chip 16 is disposed so that the electrode 18 thereof is positioned inside the device hole 24, and the end portion 20a of the lead 20 is bonded to the electrode 18.

Figure 1A:
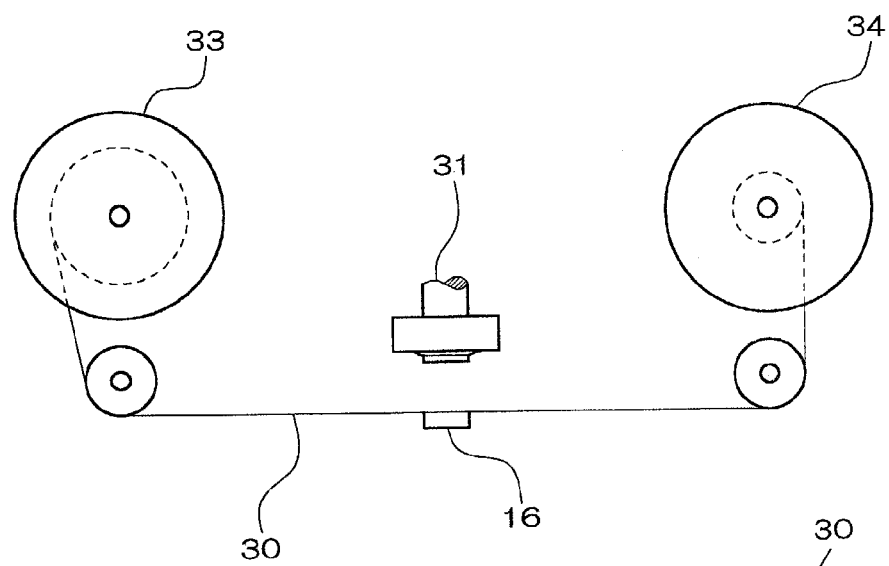
FIGS. 1A and 1B are diagrams illustrating the first embodiment of the semiconductor device fabrication method according to the present invention.
Figure 1B:
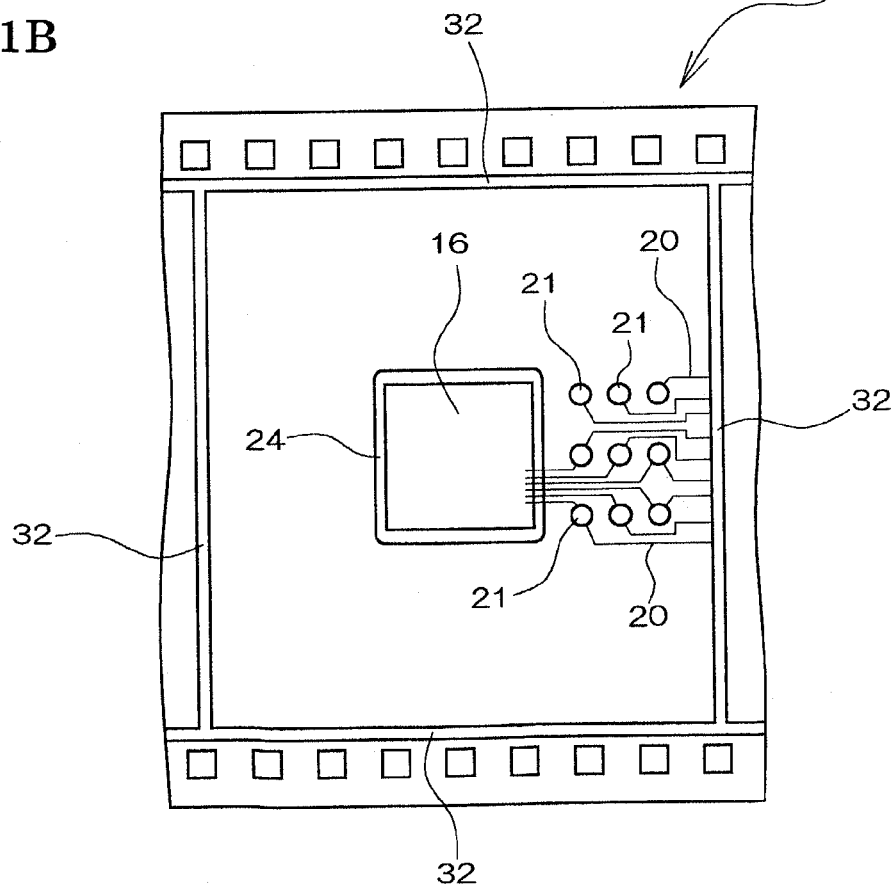

The lead 20 connects the electrode 18 of the semiconductor chip 16 with a land 21 (see FIG. 1B). The land 21 is provided with the external terminal 14. Each external terminal 14 is made of a material such as solder, for example, and the tip thereof has a ball-like shape (solder ball). Copper or the like may be used in lieu of solder as the material for the external terminal 14.

The solder resist 22 is applied onto the lead 20 side of the insulating film 12, while circumventing the external terminals 14. The surface of the lead 20 is thus covered with the solder resist 22 for protection.

A stiffener 28 having a plate-like shape, being an example of a reinforcing member, is attached to the insulating film 12 on the side opposite to the external terminals 14. The stiffener 28 is made of copper, stainless steel, copper alloy or the like, and is strong enough to maintain a planar configuration. The stiffener 28 is attached to the insulating film 12 by means of an insulating adhesive 29. The insulating adhesive 29 is applied in the form of a thermosetting or thermoplastic film. Circumventing the semiconductor chip 16, the stiffener 28 is attached to the entire surface of the insulating film 12. Thus, the stiffener 28 prevents the insulating film 12 from being distorted or warped. This ensures uniformity in the height of the external terminals 14 to improve planarity thereof, leading to enhancement of yield in the mounting of semiconductor devices on circuit boards.

Further, a heat spreader 27, being an example of a heat radiating member, is bonded to the semiconductor chip 16 on the side opposite to the surface-mounted side through a thermally conductive adhesive 25 such as silver paste. Thus, heat from the semiconductor chip 16 can be efficiently dissipated. An ordinary insulating adhesive or the insulating film mentioned above may be used in lieu of the thermally conductive adhesive 25 depending on the amount of heat produced by the semiconductor chip 16. The heat spreader 27 is formed to be larger in size than the semiconductor chip 16 and can be bonded to the stiffener 28. Between the stiffener 28 and the heat spreader 27, the thermally conductive adhesive 25 is provided for bonding them.

The connection portion between the semiconductor chip 16 and the insulating film 12 may be sealed by potting of epoxy resin 26, being an example of a sealant. The epoxy resin 26 is applied to the surface of the semiconductor chip 16 where the electrode 18 is formed and also applied to the device hole 24 and the periphery of the semiconductor chip 16.

The embodiment of the semiconductor device of the present invention has a configuration as described above, and the method of fabricating such semiconductor device is now described below.

First, as shown in FIG. 1A, a plurality of the semiconductor chips 16 are attached to the film carrier tape 30, being an example of a tape. FIG. 1B shows an enlarged view of the film carrier tape 30. Note that FIG. 1B indicates the film carrier tape 30 of FIG. 1A as viewed from above.

The film carrier tape 30 is made of material such as polyimide resin. On the film carrier tape 30, a plurality of device holes 24 are formed (one of them is indicated in FIG. 1B), and a plurality of leads 20 and a plurality of lands 21 are arranged outside each device hole 24. Circumventing the lands 21, the solder resist 22 (see FIG. 6) is applied to the side where the leads 20 are formed. In FIG. 1B, just some of the leads 20 and lands 21 are indicated while others are omitted.

The land 21 is connected to a plating lead 32 through a part of the lead 20 extending in a direction away from the device hole 24. All the leads 20, including those not shown in FIG. 1B, are connected to the plating lead 32. Using the plating lead 32, all the leads 20 and lands 21 are electroplated. Alternatively, the leads 20 and lands 21 may be plated by the electroless plating technique. In this case, it is not necessary to provide the plating lead 32.

The film carrier tape 30 mentioned above is wound on a reel 33 as shown in FIG. 1A. The end of the film carrier tape 30 is rolled out, and then rolled up by a take up reel 34 (reel-to-reel transport). The semiconductor chip 16 is bonded to the film carrier tape 30 between the reels 33 and 34 using a bonding jig 31. For this bonding process, either single-point bonding or gang bonding may be employed. With the gang bonding, the end portions 20a of all the leads 20 can be bonded to the electrodes 18 of each semiconductor chip 16 at a time.

The semiconductor chip 16 is positioned so that it protrudes from the side opposite to the lead-20 forming side of the insulating film 12 as shown in FIG. 6. Furthermore the semiconductor chip 16 is disposed within the device hole 24.

A plurality of semiconductor chips 16 are thus mounted on the film carrier tape 30 successively, and then the reel 34 takes up the film carrier tape 30 having the plurality of semiconductor chips 16 mounted thereon.

Figure 2A:
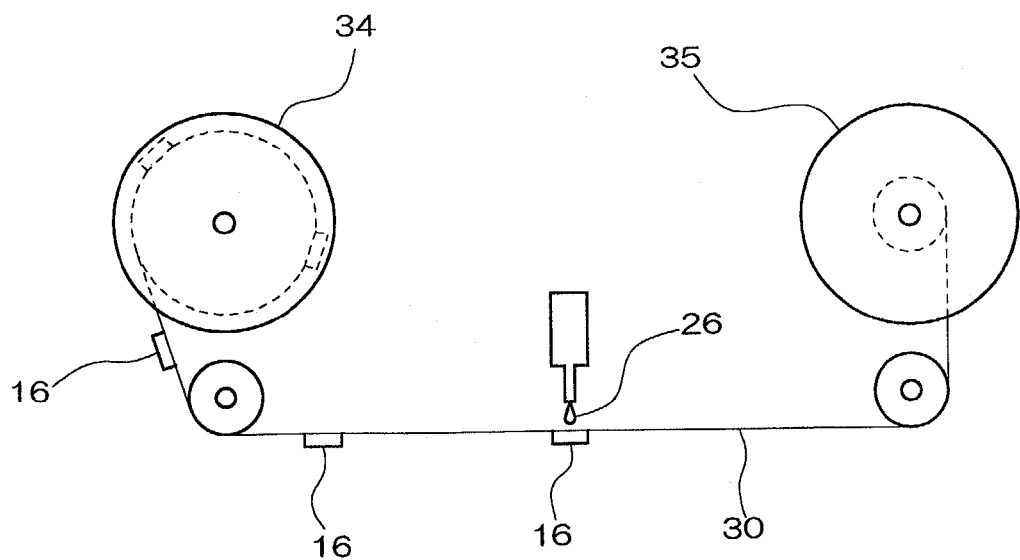
FIGS. 2A and 2B are diagrams illustrating the first embodiment of the semiconductor device fabrication method according to the present invention.

If necessary, resin sealing may be carried out. For example, as shown in FIG. 2A, the reel 34 with the film carrier tape 30 wound thereon is set on another fabrication equipment. The film carrier tape 30 is rolled out and placed between the reels 34 and 35, and the epoxy resin 26 is potted to the film carrier tape 30. Note that FIG. 2B shows a top view of the film carrier tape 30 of FIG. 2A after the epoxy resin 26 has been potted.

Figure 2B:
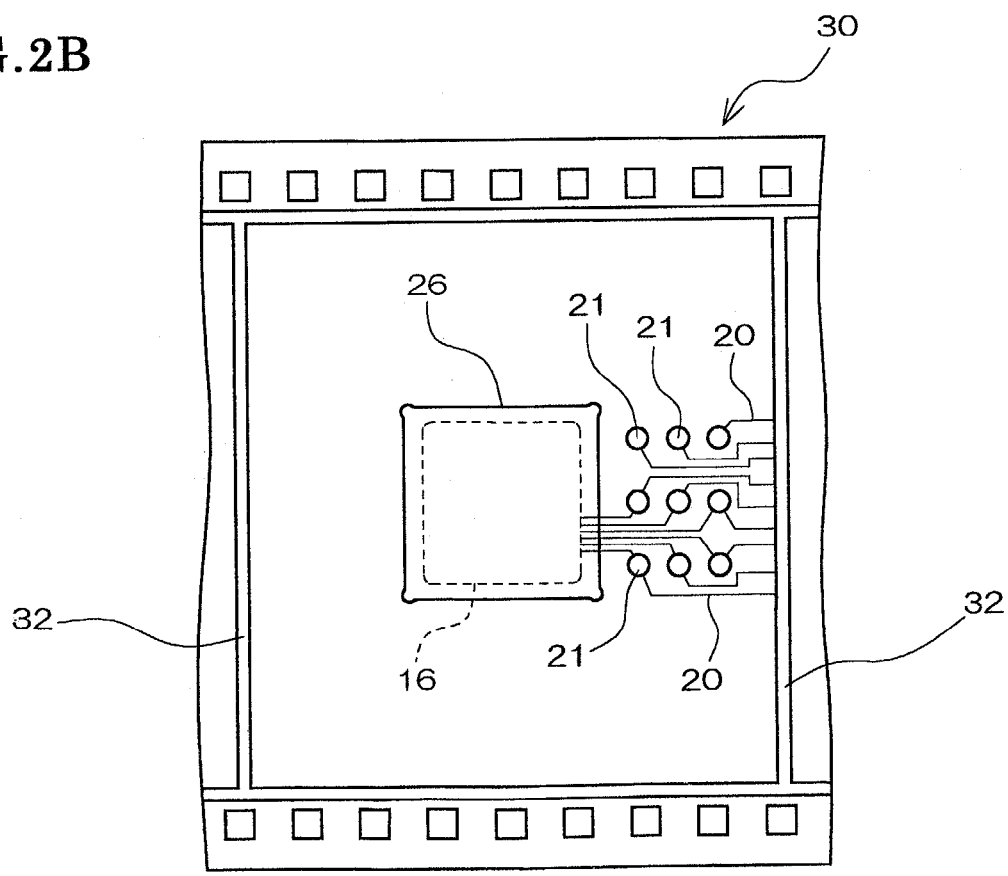

As shown in FIG. 2B, the epoxy resin 26 is applied to the lead 20 side of the film carrier tape 30 so that the semiconductor chip 16 is covered. Further, as shown in FIG. 6, the epoxy resin 26 is also applied to the periphery of the semiconductor chip 16 to seal interstices between the device hole 24 and the semiconductor chip 16 on the film carrier tape 30.

Figure 3A:
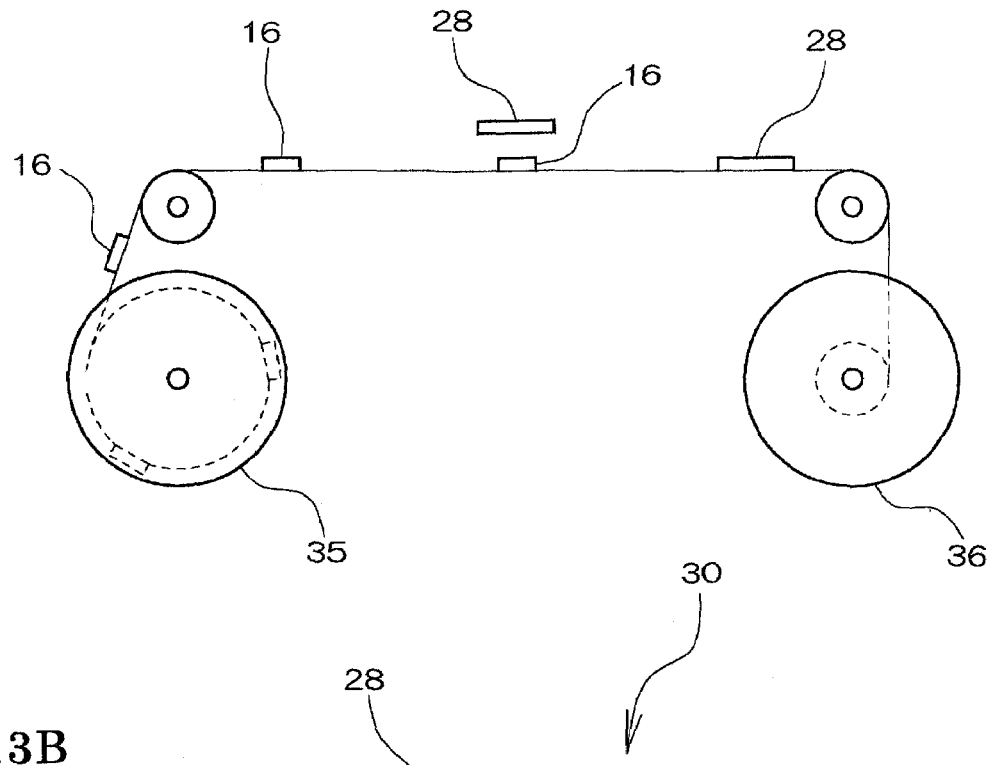
FIGS. 3A and 3B are diagrams illustrating the first embodiment of the semiconductor device fabrication method according to the present invention.
Figure 3B:
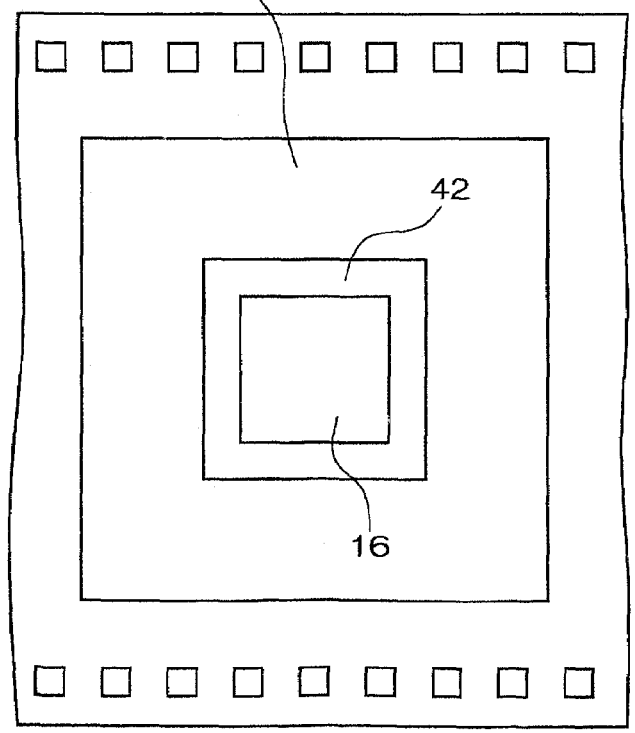

Then, as shown in FIGS. 3A and 3B, the reel 35 having the film carrier tape 30 wound thereon is set on still another fabrication equipment. The film carrier tape 30 is rolled out and placed between the reels 35 and 36, and the stiffener 28, being an example of a reinforcing member, is attached to the film carrier tape 30. Note that FIG. 3B shows a top view of the film carrier tape 30 of FIG. 3A.

Specifically, the stiffener 28 is attached to the film carrier tape 30 on the side where the semiconductor chip 16 protrudes. As shown in FIG. 6, this side of the film carrier tape 30 is opposite to the side where the leads 20 and lands 21 are provided. The stiffener 28 has a hole 42 that is larger in size than the outline of the semiconductor chip 16. The stiffener 28 is attached so that the semiconductor chip 16 is disposed inside the hole 42. For each semiconductor chip 16, an individual stiffener 28 is attached.

The stiffener 28 is bonded to the film carrier tape 30 by means of the insulating adhesive 29 as shown in FIG. 6. The insulating adhesive 29 may be prepared in the form of thermosetting or thermoplastic film and previously attached to the stiffener 28. Thus, the stiffener 28 can be thermocompression-bonded to the film carrier tape 30 on the side where the semiconductor chip 16 protrudes.

Then, if necessary a heat radiating member is attached. For example, as shown in FIGS. 4A and 4B, the reel 36 having the film carrier tape 30 wound thereon is set on another fabrication equipment. The film carrier tape 30 is rolled out and placed between the reels 36 and 37. The heat spreader 27, being an example of a heat radiating member, is then individually attached to each semiconductor chip 16. More specifically, as shown in FIG. 6, the heat spreader 27 is bonded to the semiconductor chip 16 on the side opposite to the electrodes 18 so that the stiffener 28 is covered therewith. For this bonding, the thermally conductive adhesive 25 is used. The thermally conductive adhesive 25 may be in paste or tape form. When the thermally conductive adhesive 25 in tape form is used, it may be previously attached to the heat spreader 27. The heat spreader 27 may be formed with the same outline as that of the stiffener 28 as shown in FIG. 6, or it may have a shape different from that of the stiffener 28. Since the heat spreader 27 is attached as required depending on the amount of heat produced by the semiconductor chip 16, it may be omitted if the amount of heat produced is low. Alternatively, a member forming an integral reinforcing member (stiffener) and head spreader (either a heat spreader provided with the function of reinforcing or a reinforcing member provided with the function of radiating heat) may be attached to the semiconductor chip 16 and film carrier tape 30.

A product name or the like may be marked on the heat spreader 27 as required. If the heat spreader 27 is omitted, marking may be provided on the stiffener 28.

Then when the film carrier tape 30 is wound on the reel 38, as shown in FIG. 5, this is set on yet another fabrication equipment. Then, with the film carrier tape 30 spanning between the reels 37 and 38, individual substrates (insulating film 12) are punched out. In this embodiment, the film carrier tape 30 is cut once for each area including a single semiconductor chip 16.

In the above process steps, a reel-to-reel transport system is used, but the following process steps are applied to individual substrates. Firstly, the external terminals 14 are formed. For example, preformed solder balls can be mounted on the lands 21, and by means of are flow step the external terminals 14 can be formed. After providing the external terminals 14, a washing step is preferably provided. Then for each piece of insulating film 12, tests are carried out, including for example a visual mounting check and a test of electrical characteristics, to obtain the finished product.

According to this embodiment, the step of attaching the semiconductor chip 16, the step of applying the reinforcing member (for example the stiffener 28), and the step of cutting the tape (for example the film carrier tape 30) are all carried out continuously, using a reel-to-reel transport system. Therefore, the productivity is improved, and the manufacturing costs can be reduced. However, since it is difficult to form the external terminals 14 in a reel-to-reel transport system, the external terminals 14 are provided after cutting the tape (for example film carrier tape 30) in this embodiment. According to this embodiment, the external terminals 14 can be provided using a general-purpose device. If a faulty sample occurs in the step of providing the external terminals 14, the disposal losses are less than in a reel-to-reel transport system.

Second Embodiment

Figure 7A:
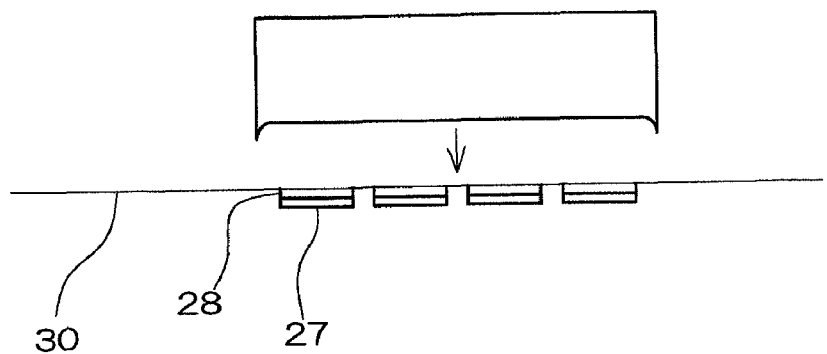
FIGS. 7A and 7B are diagrams illustrating the second embodiment of the semiconductor device fabrication method according to the present invention.
Figure 7B:
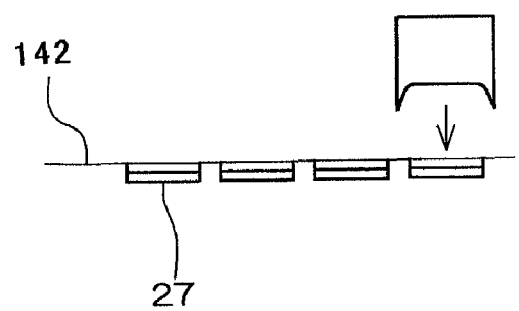

FIGS. 7A and 7B show a second embodiment of the present invention. In this embodiment, as shown in FIG. 7A, the film carrier tape 30 is cut once for each area including a group of (at least two) semiconductor chips 16 (in FIG. 7A the area including a plurality of the stiffeners 28 and a plurality of the heat spreaders 27). It should be noted that the group (plurality) of semiconductor chips 16 may be arranged in a single row longitudinally on the tape (film carrier tape 30), or may be arranged in a plurality of rows and a plurality of columns.

Then external terminals are provided on a substrate 142 having mounted a group (plurality) of the semiconductor chips 16, and cut from the film carrier tape 30. In this step, the description in the first embodiment can be applied.

Next, as shown in FIG. 7B, the substrate 142 can be further cut for each individual semiconductor chip 16, to obtain the individual semiconductor device. In this embodiment too, the effects described in the first embodiment can be obtained.

Third Embodiment

Figure 8:
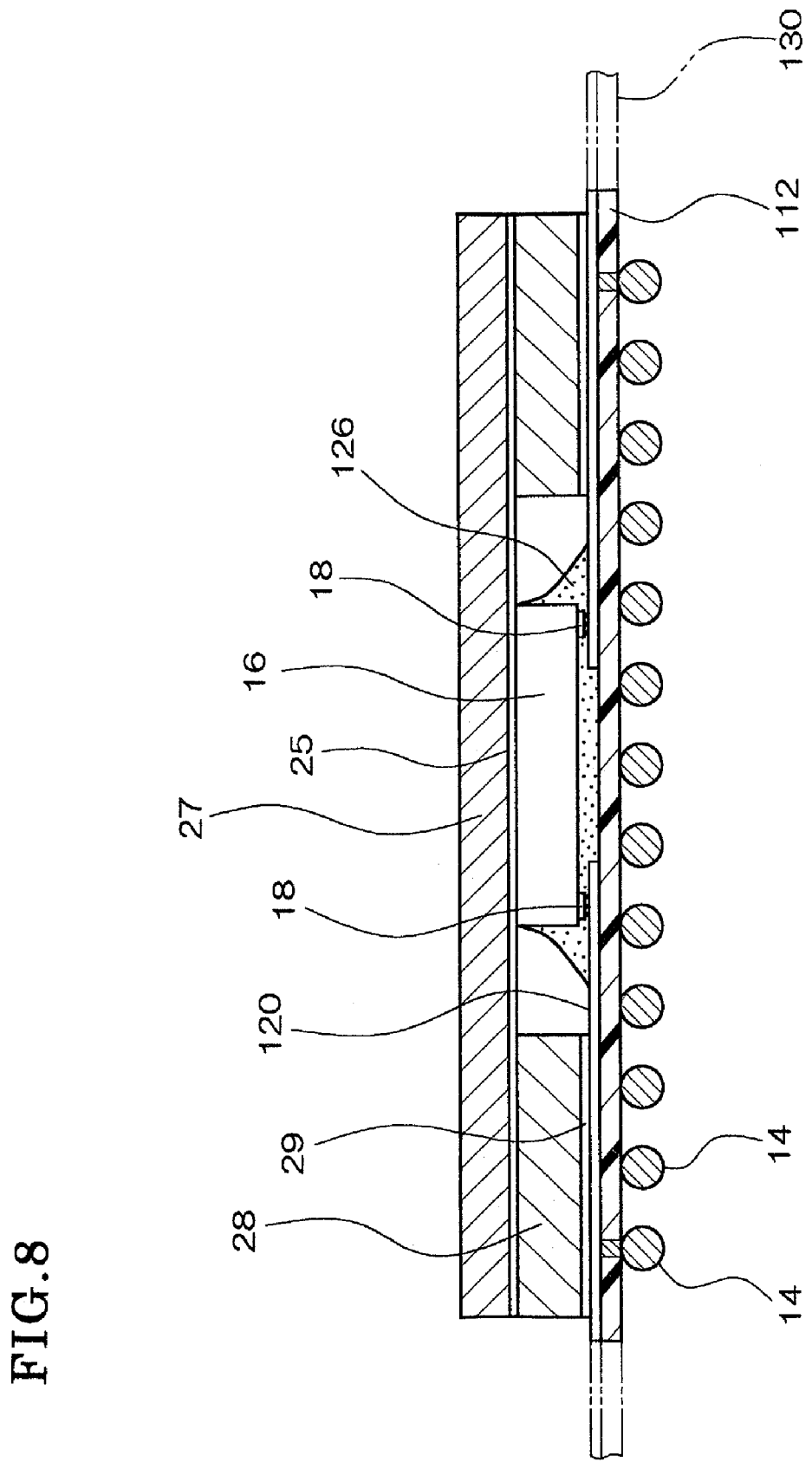
FIG. 8 is a diagram illustrating the third embodiment of the semiconductor device fabrication method according to the present invention.

* FIG. 8 shows a third embodiment of the present invention. In this embodiment, a semiconductor chip 16 is bonded to a tape 130 in a face-down configuration. That is to say, the semiconductor chip 16 is mounted on the tape 130 with the surface on which the electrodes 18 are formed facing the leads 120 formed on the tape 130. The semiconductor chip 16 is fixed to the tape 130 by an adhesive 126.

The adhesive 126 may be an adhesive in liquid or gel form, or may be an adhesive sheet in sheet form. The adhesive 126 may have an epoxy resin as a principal constituent. The adhesive 126 may also be insulating.

To improve the electrical connection between the items being connected, the adhesive 126 may include a conductive substance. The conductive substance may be, for example, a brazing material, solder, or the like in particle form, and this may be dispersed in the adhesive material. By this means, when the items to be connected are connected, the particles act as a brazing material and allow the connection to be greatly improved.

The adhesive 126 may be an anisotropic conductive adhesive (ACA) having conductive particles dispersed therein, such as an anisotropic conductive film (ACF) or anisotropic conductive paste (ACP). The anisotropic conductive adhesive has conductive particles (filler) dispersed in a binder, and may also include a dispersant. As the binder of the anisotropic conductive adhesive, a thermosetting adhesive is commonly used. In this case, between the leads 120 and the electrodes 18, the interposed conductive particles provide electrical continuity between the two.

It is sufficient for the adhesive 126 to be provided only in the area to be adhered, but it may equally be provided to spread outside that area. If this is done, the surroundings of the connection can be mechanically protected by the adhesive 126. By means of the adhesive 126 for adhering the semiconductor chip 16, the stiffener 28 may be adhered to the tape 130.

As the adhesive 126, an insulating adhesive may be used, and using the contraction force thereof, the leads 120 and electrodes 18 may be directly bonded. In this case, it is preferable that conductive projections (bumps) are formed on at least either of the electrodes 18 and leads 120.

For the electrical connection between the leads 120 and electrodes 18, metal bonding using Au—Au, Au—Sn, solder, or the like may be applied. The metal bonding may be formed at the points of contact of the leads 120 and electrodes 18. For example, at the points of contact of the leads 120 and electrodes 18, heat alone, ultrasonic vibration alone, or ultrasonic vibration and heat, or other means may be applied to bond the two. When bonded, the material of the leads 120 and electrodes 18 is diffused by the heat or ultrasonic vibration, to form a metal bond.

In this case, after electrical connection, a resin (known as an underfill material) may be used to fill the space between the semiconductor chip 16 and the tape 130 in place of the adhesive 126.

Next, the stiffener 28 being an example of a reinforcing member is attached to the tape 130, and the tape 130 is cut. For the above step the description in the first and second embodiments can be applied.

Then as shown in FIG. 8, a plurality of external terminals 14 is formed. For example, through holes and the like are formed in the substrate 112 cut from the tape 130, and on the surface opposite to the surface of formation of the leads 120, a plurality of external terminals 14 is provided. In this step, the description in the first embodiment can be applied.

In this embodiment too, the effects described in the first embodiment can be obtained.

Fourth Embodiment

Figure 9:
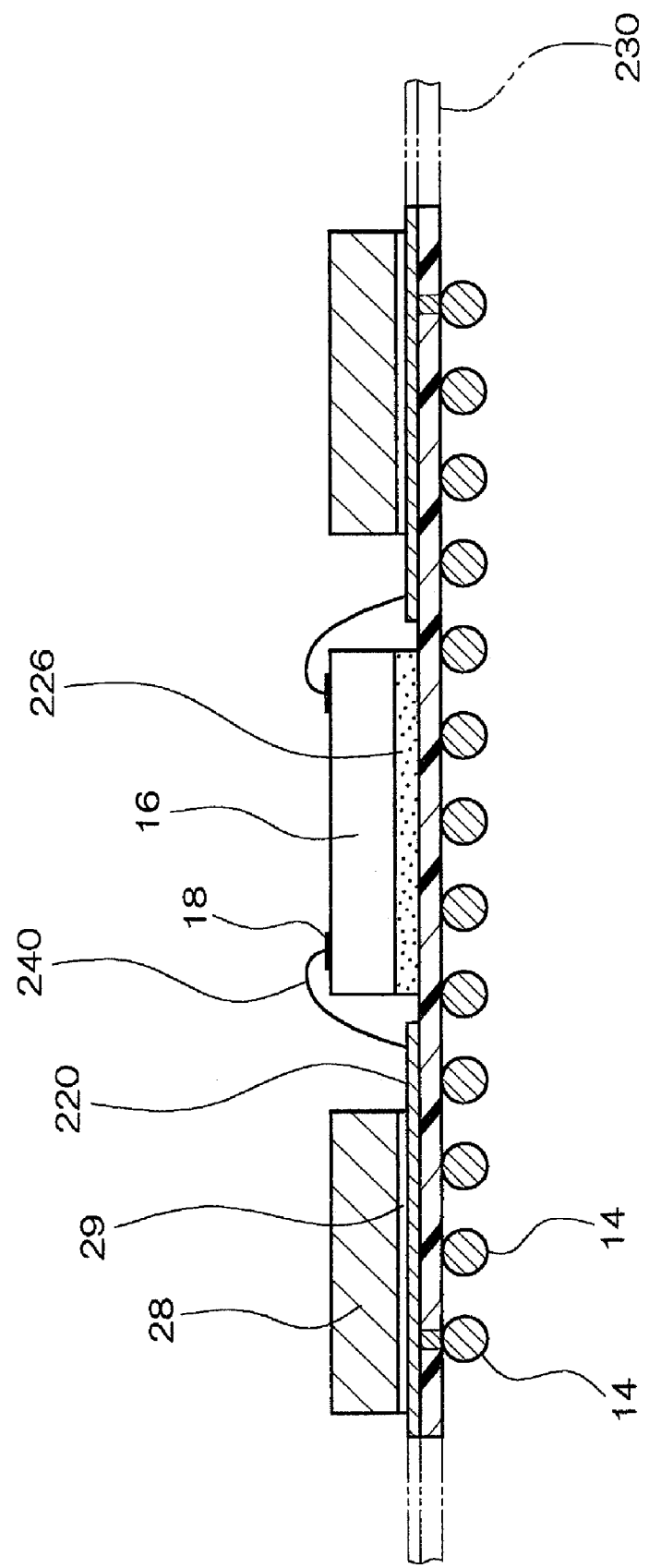
FIG. 9 is a diagram illustrating the fourth embodiment of the semiconductor device fabrication method according to the present invention.

FIG. 9 shows a fourth embodiment of the present invention. In this embodiment, the semiconductor chip 16 is bonded to a tape 230 in a face-up configuration. The semiconductor chip 16 is mounted on the tape 230 with the surface opposite to the surface on which the electrodes 18 are formed facing leads 220 formed on the tape 230. The semiconductor chip 16 is fixed to the tape 230 by an adhesive 226. By means of the adhesive 226 for adhering the semiconductor chip 16 to the tape 230 may adhere the stiffener 28 to the tape 230.

In the example shown in FIG. 9, the electrodes 18 of the semiconductor chip 16 and the leads 220 are electrically connected by wires 240. In at least the position of connection of the electrodes 18 and leads 220 by the wires 240, a sealant (for example resin) is preferably used for sealing.

In this embodiment too, the effects described in the first embodiment can be obtained.

Fifth Embodiment

FIG. 10 shows a fifth embodiment of the present invention. This figure, to be more precise, shows a modification method of formation of the external terminals described in the first embodiment.

Figure 10A:
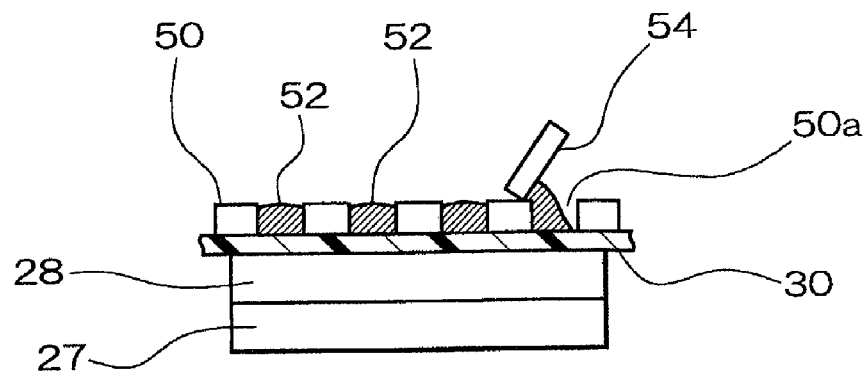
FIGS. 10A to 10C are diagrams illustrating the fifth embodiment of the semiconductor device fabrication method according to the present invention.
Figure 10B:
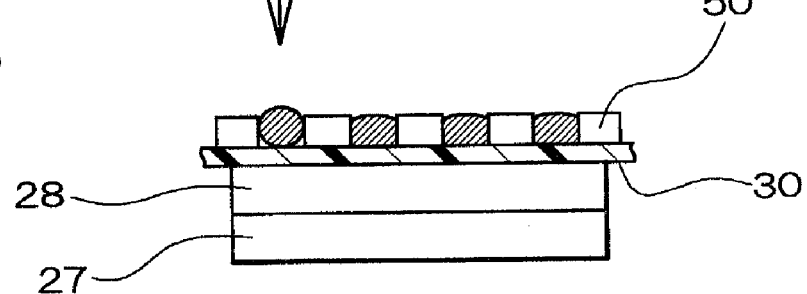
Figure 10C:
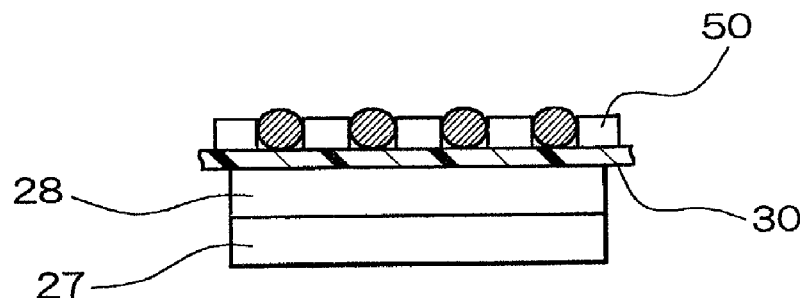

As shown in FIG. 10A, a metal mask 50 is disposed on the land 21 side of the film carrier tape 30 (see FIG. 1B) so that an opening 50a of the metal mask 50 is positioned on each land 21. Then, cream solder 52 is put on the metal mask 50, and the opening 50a of the metal mask 50 is filled with the cream solder 52 by means of a squeegee 54. Subsequently, as shown in FIG. 10B, the cream solder 52 filled in each opening 50a is irradiated with a laser beam to be melted into a ball shape due to surface tension, and then it is cooled. As shown in FIG. 10C, all lumps of the cream solder 52 on the openings 50a are formed to have a ball shape in this manner, whereby the external terminals 14 are formed.

The present invention is not limited in its application to the above-mentioned embodiments and various changes and modifications may be made therein. For example, instead of the foregoing embodiment in which the film carrier tape 30 is taken up by a reel at each step up to the step of cutting the tape, a series or plurality of steps may be carried out in the same reel-to-reel operation. In the step shown in FIG. 3, for instance, the process of attaching the stiffener 28 may be followed by the process of attaching the heat spreader 27 shown in FIG. 4 between the reels 35 and 36. Alternatively, a reinforcing member having an integrated form of the stiffener 28 and the heat spreader 27 may be attached to the film carrier tape 30.

Further, the present invention is applicable to a front-TAB type in which the semiconductor chip 16 is mounted on the side on which the external terminals 14 are formed, as well as a back-TAB type in which the semiconductor chip 16 is mounted on the side opposite to the side on which the external terminals 14 are formed as shown in FIG. 6. Furthermore, a B-TAB type of insulating film having integrally formed bumps on the leads 20 may be used instead of the insulating film 12. Still further, single-point bonding may be carried out by using a film carrier tape having no bumps.

Figure 11:
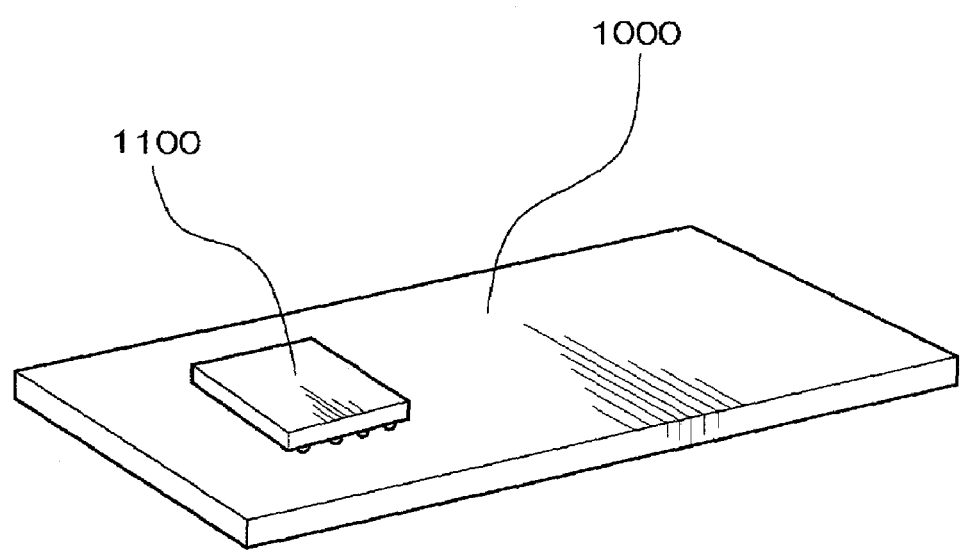
FIG. 11 is a diagram showing the embodiment of the circuit board according to the present invention.

FIG. 11 shows a circuit board 1000 on which a semiconductor device 1100 fabricated according to the present invention is mounted. It is common practice to use a circuit board made of organic resin such as glass epoxy resin, for example. On the circuit board, wiring patterns made of copper or the like are formed to form the desired circuits, and bumps of the semiconductor device are physically connected with these wiring patterns to provide electrical continuity.

Figure 12:
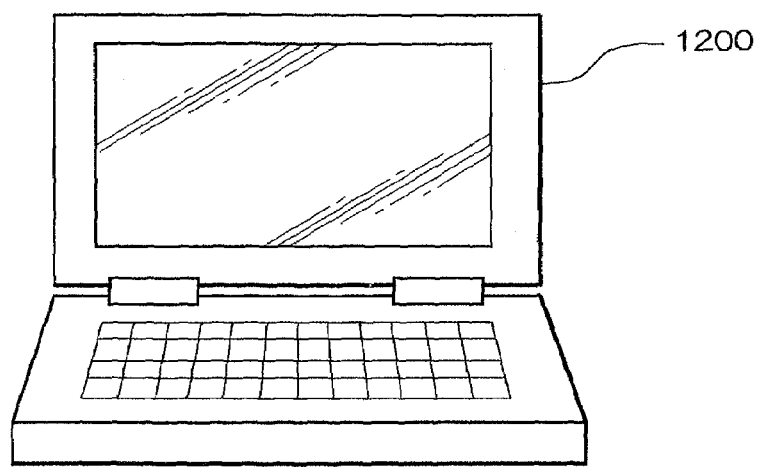
FIG. 12 is a diagram showing an electronic apparatus including a circuit board on which is mounted the semiconductor device fabricated according to the method of the present invention.
Figure 13:
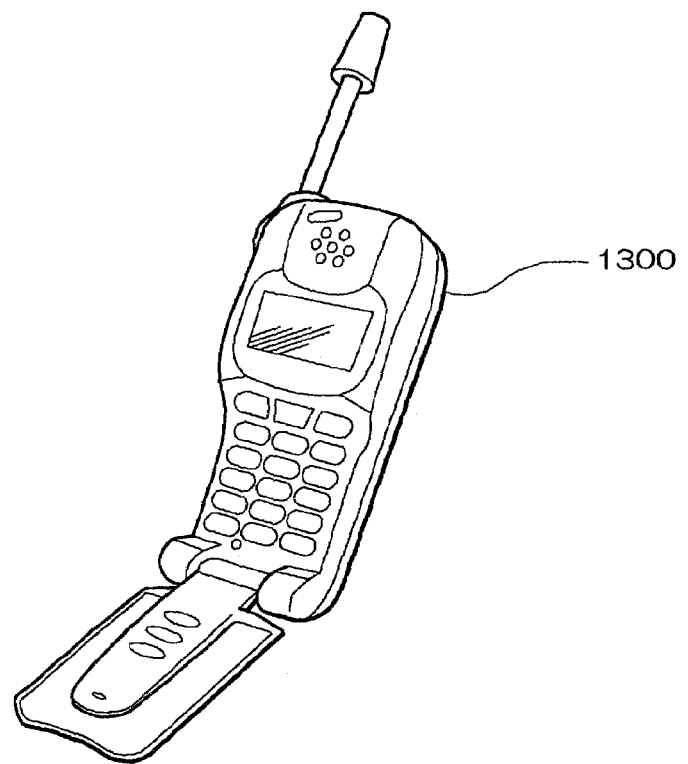
FIG. 13 is a diagram showing an electronic apparatus including a circuit board on which is mounted the semiconductor device fabricated according to the method of the present invention.

Then as an electronic apparatus equipped with the circuit board 1000, FIG. 12 shows a notebook-type personal computer 1200, and FIG. 13 shows a mobile telephone 1300.

In addition, by applying the present invention described above, it is also possible to fabricate surface-mounting-type electronic components (either active or passive parts) having a plurality of external terminals as in semiconductor devices, for example, such electronic components as resistors, capacitors, coils, oscillators, filters, temperature sensors, thermistors, varistors, variable resistors, and fuses.

Figure 14A:
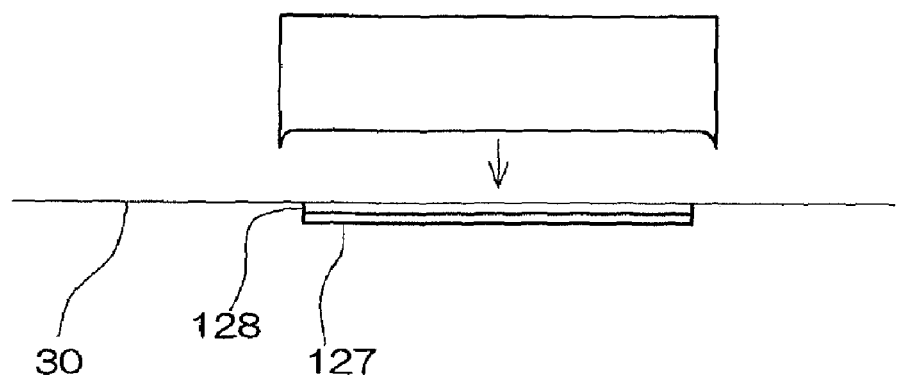
FIGS. 14A and 14B are diagrams illustrating a modification of the second embodiment of the present invention.
Figure 14B:
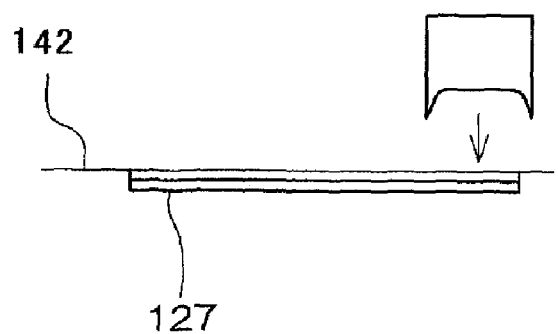

In the example shown in FIG. 7A, a member having at least either or both of the stiffener 28 and heat spreader 27 integrally formed is an individual element. In contradistinction, in the example shown in FIG. 14A, a member having at least either or both of the stiffener 128 and heat spreader 127 integrally formed is a plurality of individual elements collected together. Each individual element corresponds to a semiconductor chip 16. In this case, as shown in FIG. 14B, in the step of cutting the substrate 142, the member having the stiffener 128, or heat spreader 127, or both, integrally formed, is cut into individual semiconductor chips 16.

What is claimed is:

1. A method of fabricating a semiconductor device comprising, in order, the steps of:
    (a) attaching a plurality of semiconductor chips to a continuous semiconductor substrate tape in a reel-to-reel transport system;
    (b) cutting the continuous semiconductor substrate tape to obtain individual semiconductor substrates, each including a single semiconductor chip; and
    (c) providing a plurality of external terminals on each of the individual semiconductor substrates.

2. The method of fabricating a semiconductor device as defined in claim 1, step (a) further comprising:
    attaching a reinforcing member to the continuous semiconductor substrate tape at positions corresponding to each of the semiconductor chips.

3. A method of fabricating a semiconductor device comprising, in order, the steps of:
    (a) providing a continuous semiconductor substrate tape in a reel-to-reel transport system, including forming a plurality of device holes in the continuous semiconductor substrate tape and forming leads on the continuous semiconductor substrate tape, where end portions of the leads project into respective device holes;
    (b) attaching a reinforcing member to the continuous semiconductor substrate tape at positions corresponding to the respective device holes;
    (c) attaching a plurality of semiconductor chips to the continuous semiconductor tape, including disposing each of the semiconductor chips within a respective one of the device holes, and bonding the leads with electrodes of the semiconductor chips;
    (d) cutting the continous semiconductor substrate tape to obtain individual semiconductor substrates; and
    (e) providing a plurality of external terminals on each of the individual semiconductor substrates.

4. The method of fabricating a semiconductor device as defined in claim 3,
    wherein step (d) includes cutting the continuous semiconductor substrate tape into regions each including one of the semiconductor chips.

5. The method of fabricating a semiconductor device as defined in claim 3,
    wherein step (d) includes cutting the continuous semiconductor substrate tape into regions each including two or more of the semiconductor chips.

6. The method of fabricating a semiconductor device as defined in claim 5, further comprising:
    cutting each of the regions into subregions, each including one of the semiconductor chips, after the step (e).

7. The method of fabricating a semiconductor device as defined in claim 1,
    wherein each of the semiconductor chips is bonded to the tape in a face-down configuration in the step (a).

8. The method of fabricating a semiconductor device as defined in claims 7,
wherein by means of an anisotropic conductive material, the electrodes of the semiconductor chips and leads formed above the tape are electrically connected in the step (a).

9. The method of fabricating a semiconductor device as defined in claim 1,
wherein step (a) further includes bonding each of the semiconductor chips to the continuous semiconductor substrate tape in a face-up configuration.

10. The method of fabricating a semiconductor device as defined in claim 9,
wherein step (a) further includes electrically connecting with wires electrodes of the semiconductor chips and leads formed on the continuous semiconductor substrate tape.

11. The method of fabricating a semiconductor device as defined in claim 1, further comprising:
attaching a heat radiating member to each of the semiconductor chips.

12. The method of fabricating a semiconductor device as defined in claim 2, further comprising:
attaching a heat radiating member to each of the semiconductor chips.

13. The method of fabricating a semiconductor device as defined in claim 1, step (a) further comprising:
attaching a heat radiating member.

14. The method of fabricating a semiconductor device as defined in claim 2, step (a) further comprising:
attaching a heat radiating member.

15. A semiconductor device fabricated by the method as defined in claim 1.

16. A circuit board having mounted the semiconductor device as defined in claim 15.

17. An electronic apparatus including the semiconductor device as defined in claim 15.

18. The method of fabricating a semiconductor device as defined in claim 3, step (a) further comprising:
attaching a heat radiating member to each of the semiconductor chips.

19. A semiconductor device fabricated by the method as defined in claim 3.

20. An electronic apparatus including the semiconductor device as defined in claim 19.

* * * * *